(12) United States Patent
Niederl

(10) Patent No.: US 8,890,629 B2
(45) Date of Patent: Nov. 18, 2014

(54) OSCILLATOR CIRCUIT WITH COMPARATOR

(75) Inventor: Josef Niederl, Klagenfurt-Woelfnitz (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/552,095

(22) Filed: Jul. 18, 2012

(65) Prior Publication Data

US 2013/0021109 A1 Jan. 24, 2013

(30) Foreign Application Priority Data

Jul. 21, 2011 (DE) .......................... 10 2011 052 010

(51) Int. Cl.
*H03K 3/26* (2006.01)
*H03K 3/0231* (2006.01)

(52) U.S. Cl.
CPC .................................... *H03K 3/0231* (2013.01)
USPC .......................................... 331/111; 331/143

(58) Field of Classification Search
CPC ............................ H03K 3/354; H03K 3/0231

USPC .......................................... 331/111, 113, 143
See application file for complete search history.

(56) References Cited

U.S. PATENT DOCUMENTS

| 4,963,840 | A | 10/1990 | Thommen |
| 5,206,609 | A | 4/1993 | Mijuskovic |
| 7,859,355 | B2 * | 12/2010 | Brennan et al. ............... 331/183 |
| 7,863,992 | B2 * | 1/2011 | Chung .......................... 331/111 |
| 2007/0030085 | A1 | 2/2007 | Brennan et al. |
| 2010/0171558 | A1 | 7/2010 | Kim et al. |
| 2010/0237955 | A1 | 9/2010 | Mahooti |

FOREIGN PATENT DOCUMENTS

| CN | 1848641 A | 10/2006 |
| CN | 101926079 A | 12/2010 |
| WO | 2011045280 A1 | 4/2011 |

* cited by examiner

*Primary Examiner* — Arnold Kinkead
(74) *Attorney, Agent, or Firm* — Eschweiler & Associates, LLC

(57) ABSTRACT

An oscillator circuit with a comparator is provided, wherein the comparator has a supply input. A supply circuit supplies the comparator with a first current during a first section of an oscillator period of the oscillator circuit and with a second current greater than the first current during a second, different section of the oscillator period.

19 Claims, 3 Drawing Sheets

OSCILLATOR CIRCUIT WITH COMPARATOR

REFERENCE TO RELATED APPLICATION

This application claims priority to German patent application number 102011052010.4 filed on Jul. 21, 2011, the contents of which is hereby incorporated by reference.

FIELD

The following application relates to oscillator circuits comprising a comparator, and to methods for operating oscillator circuits of this type.

BACKGROUND

One example of oscillator circuits which use comparators is so-called relaxation oscillators. In relaxation oscillators of this type, a frequency of the oscillator circuit is typically determined by charging/discharging processes of a capacitor in an RC element. If, for example, a capacitor of this type is charged or discharged to a specific degree, an output terminal of a comparator, which compares a voltage present at the capacitor with a reference voltage, changes its output level, which in turn causes a change in a level of an output signal of the oscillator. Oscillators of this type can be used, for example, to generate oscillations in the range of up to more than 100 MHz, wherein oscillators of this type are used, in particular, below a few MHz, for example in the range of 32 kHz, since in this range they have a relatively low current consumption that decreases as the frequency decreases.

The frequency accuracy of oscillator circuits of this type is dependent, inter alia, on an accuracy of the comparator. In this case, comparators are supplied with a current, wherein the accuracy of the comparator is usually greater at a higher supply current than at a lower supply current. On the other hand, for many applications a lower current flow is desirable in order to save current and, consequently, for example in mobile applications, particularly if the oscillator circuit is required in a quiescent operating mode, to save energy in order to lengthen a rechargeable battery life.

SUMMARY

In one or more embodiment of the present invention oscillator circuits and methods for operating oscillator circuits are disclosed that enable a relatively high accuracy in conjunction with a relatively low current consumption.

In some exemplary embodiments, for example, a smaller first current can be fed as a supply current to a comparator of an oscillator circuit during a noncritical section of an oscillator period, while a larger second current is fed as a supply current in a critical second section, for example a section around a changeover of the comparator, of the oscillator period. What can thereby be achieved in some exemplary embodiments is that a high accuracy is present in the critical range and a total current consumption is nevertheless relatively low.

BRIEF DESCRIPTION OF THE DRAWINGS

Exemplary embodiments of the invention are explained in greater detail below with reference to the accompanying drawing.

DETAILED DESCRIPTION

Various exemplary embodiments of the invention are explained in detail below. These exemplary embodiments should not be interpreted as restricting the scope of the invention, since realizations other than those illustrated are also possible. Features of different exemplary embodiments can be combined with one another, unless indicated otherwise. The description of one exemplary embodiment comprising a multiplicity of features should not, moreover, be interpreted to the effect that all these features are necessary for implementing the invention, since other exemplary embodiments can also have fewer features and/or alternative features.

In particular, exemplary embodiments of oscillator circuits and corresponding methods for operating oscillator circuits are explained below. In this case, an oscillator circuit should generally be understood as a circuit which is designed for outputting a periodic signal, wherein a frequency of the periodic signal can be predefined or adjustable.

Figure 1:
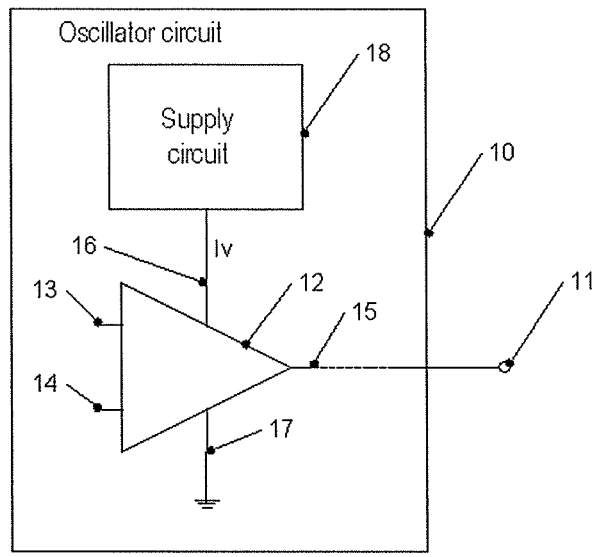
FIG. 1 is a block diagram of an oscillator circuit in accordance with one exemplary embodiment.

FIG. 1 illustrates a schematic block diagram of an oscillator circuit 10 in accordance with one exemplary embodiment. In this case, the exemplary embodiment in FIG. 1 serves, in particular, to elucidate some principles which can be used in different exemplary embodiments. Therefore, elements of the oscillator circuit 10 which are not necessary for this purpose are not illustrated in FIG. 1.

The oscillator circuit 10 in FIG. 1 comprises a comparator 12, which compares a first signal at a first comparator input 13 with a second signal at a second comparator input 14 and outputs a result of the comparison at a comparator output 15. The first signal and/or the second signal can comprise, for example, a reference signal and/or a voltage level dependent on a charge state of a capacitor.

In the exemplary embodiment in FIG. 1, the comparator output 15 is coupled to an output 11 of the oscillator circuit 10, wherein this coupling, as indicated by a dashed line in FIG. 1, can also be an indirect coupling with one or more interposed elements, for example buffers, registers, flip-flops or the like.

The comparator 12 additionally has a first supply input 16 and a second supply input 17, via which the comparator 12 is supplied with a supply current Iv. In this case, the second supply input 17 is coupled to ground or a negative supply voltage (VSS), while the first supply input 16 is coupled to a supply circuit 18 for generating the current Iv. In this case, the supply circuit 18 can be coupled to a positive supply voltage, e.g. VDD.

In one exemplary embodiment, the accuracy of the comparator 12, i.e. the accuracy of the conducted comparison of the first signal with the second signal, is dependent on the magnitude of the current Iv, wherein a larger current (within a permitted range) corresponds to a higher accuracy.

In the exemplary embodiment in FIG. 1, the supply circuit 18 is in this case designed to vary the current Iv and, in particular, to feed a first current during a first section of an oscillator period of the oscillator circuit 10, i.e. a period of the output signal of the oscillator circuit 10, and a second current during a second section of the oscillator period, wherein the second current is greater than the first current. In this case, the first current can also be equal to 0. It goes without saying that it is also possible to provide even further sections of the oscillator period, in which the current can assume still other values.

Consequently, the accuracy of the comparator 12 is altered during an oscillator period. In particular, a critical range in which, for example, an output signal at the comparator output 15 changes over between two values can lie in the second section, such that a higher accuracy is achieved in the critical range, while otherwise a current consumption of the oscillator circuit 10 is reduced by reduction of the current Iv.

As mentioned, in this case the first current can also be 0, i.e. in some exemplary embodiments no current is fed to the comparator 12 in a part of each oscillator period. In other exemplary embodiments a current is fed during the entire oscillator period in order to achieve a defined level of the output signal of the comparator 12, for example to keep a present level stable.

Figure 2:
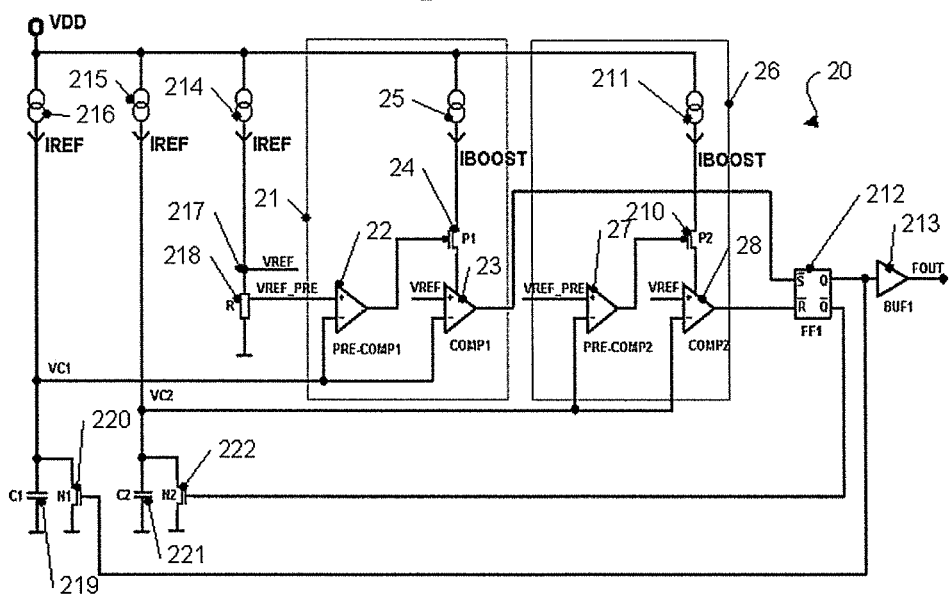
FIG. 2 is a circuit diagram of an oscillator circuit in accordance with one exemplary embodiment.

Comparators such as the comparator 12 can be used, for example, in so-called relaxation oscillators. A relaxation oscillator in accordance with one exemplary embodiment is illustrated in FIG. 2.

An oscillator circuit 20 in FIG. 2 comprises a first comparator block 21 and a second comparator block 26, wherein, as will be explained in greater detail below, only one of the comparator blocks is ever active at a given point in time.

As will be explained in greater detail further below, in the first comparator block 21 a voltage VC1 dropped across a first capacitor 219 is compared with a reference voltage VREF, and in the second comparator block 26 a voltage VC2 dropped across a second capacitor 221 is compared with the reference voltage VREF. In this case, the first capacitor 219 is charged by means of a current source 216, which generates a reference current IREF, and the second capacitor 221 is charged by means of a current source 215, which likewise generates a reference current IREF. The first capacitor 219 is discharged via a first NMOS transistor 220, and the second capacitor 221 is discharged via a second transistor 222.

An output of the first comparator block 21 is connected to a set input of a flip-flop 212, and an output of the second comparator block 26 is connected to a reset input of the flip-flop 212. An output of the flip-flop 212 is connected via a buffer 213 to an output of the oscillator circuit 20 in order to output an output signal FOUT, and is additionally connected to a gate input of the first NMOS transistor 220. In other exemplary embodiments, the buffer 213 can also be omitted. An inverted output of the flip-flop 212 is connected to a gate input of the second NMOS transistor 222, such that the first NMOS transistor 220 and the second NMOS transistor 222 are alternately turned on.

In the exemplary embodiment in FIG. 2, the reference voltage VREF is generated by means of a current source 214, which generates a current IREF, and a resistor R 218, which functions as a voltage divider, at a node 217. In this case, in the exemplary embodiment in FIG. 2, the resistor R 218 functioning as a voltage divider has a plurality of resistor components, such that a further reference voltage VREF_PRE can additionally be tapped off, which is less than the reference voltage VREF.

It should be noted that the current sources 214-216 can also generate different currents, and also in some instances need not be provided as explicit elements. By way of example, the resistor 218 can simply effect voltage division between ground and a positive supply voltage VDD, without an explicit current source being provided as a discrete element.

The functioning of the comparator blocks 21, 26 is explained in greater detail below.

The first comparator block 21 has a comparator 23, in which the reference voltage VREF is compared with the voltage VC1 dropped across the first capacitor 219. At the beginning of a cycle, e.g. at the beginning of an oscillator period, the first capacitor 219 is in this case discharged. As a result of charging by means of the current source 216, the voltage VC1 at the first capacitor 219 then rises until the reference voltage VREF is reached and the comparator 23 thus changes over. Via the flop-flop 212, this in turn changes the output signal FOUT and then additionally switches the first NMOS transistor 220 into a conducting state and the second NMOS transistor 222 into a non-conducting state, such that then the first capacitor 219 is discharged and the second capacitor 221 is charged by means of the current source 215. A comparator 28 of the second comparator block 26 then compares the continuously rising voltage VC2 at the second capacitor 221 with the reference voltage VREF and changes over when the reference voltage VREF is reached, which, via the flip-flop 212, in turn leads to a change in the output of the oscillator and to a "changeover" of the NMOS transistors 220, 222, i.e. the NMOS transistor 222 then becomes conducting and the NMOS transistor 220 non-conducting, whereupon the cycle begins anew. In this case, the frequency of the output signal is dependent on a resistance value R of the resistor 218 and on a capacitance value C1 of the first capacitor 219 and C2 of the second capacitor 221, wherein it is assumed here that the capacitance values C1, C2 are identical and are C and the currents generated by the current sources 215 and 216 are identical, in accordance with $$f=1/(2 \cdot R \cdot C + \Delta T),$$

where f is the frequency of the output signal and $\Delta T$ is a frequency error caused by inaccuracies of the comparators 23, 28. By altering the currents of the current sources 215, 216 and/or the capacitance values C1, C2, it is possible to alter, in particular, a duty cycle of the output signal. Given C1/I1=C2/I2, wherein I1 is the current supplied by the current source 216 and I2 is the current supplied by the current source 215, the duty cycle in the exemplary embodiment illustrated is 50%. This is the case, for example, for C1=C2 and I1=I2. For C1/I1≠C2/I2, the duty cycle is then different than 50%.

In order to keep this frequency error as small as possible, it is desirable to feed a relatively high current for supply to the comparators 23, 28 since this increases the accuracy of the comparators. On the other hand, feeding a higher current leads to a higher current consumption.

In order to minimize the current consumption and nevertheless to obtain an accuracy that is as high as possible, the first comparator block 21 and the second comparator block 26 each have a supply circuit. In the first comparator block 21, the supply circuit comprises a pre-comparator 22, a first PMOS transistor 24 and a current source 25. The supply circuit of the second comparator block 26 comprises a pre-comparator 27, a second PMOS transistor 210 and a current source 211. The functioning of the supply circuit is identical for the first comparator block and for the second comparator block and will therefore be explained in detail only once for the first comparator block 21.

If the comparator block 21 is active, the pre-comparator 22 compares the voltage VC1 present at the first capacitor 219 with the further reference voltage VREF_PRE, which is less than the reference voltage VREF. As long as the voltage VC1 is less than VREF_PRE, the pre-comparator 22 switches the first PMOS transistor 24 into a non-conducting state, such that the comparator 23 is not supplied with current from the current source 25, wherein the current is designated as IBOOST in FIG. 2. In this case, the pre-comparator 22 can be supplied with a comparatively small current since high accuracy is not required for the operation of the pre-comparator 22. While the first PMOS transistor 24 is switched into a non-conducting state, the comparator 23 can be supplied with a small current (not illustrated) in order to obtain a defined output level of the comparator 23.

If the voltage VC1 reaches the further reference voltage VREF_PRE, the pre-comparator 22 changes over and thus switches the first PMOS transistor 24 into a conducting state, as a result of which the comparator 23 is supplied with current from the current source 25. The current from the current source 25 can be a relatively high current in order to achieve a high accuracy of the comparator 23. Consequently, the comparator 23 then has a relatively high accuracy for voltages VC1 between VREF_PRE and VREF, such that the correct changeover instant, i.e. VC1=VREF, can be detected with a relatively high accuracy. However, since this relatively high current is fed only for a relatively small section of each oscillator period, i.e. each period of the output signal FOUT, and otherwise only a small current is fed, the total current consumption is low in the exemplary embodiment in FIG. 2.

As already mentioned, the supply circuit comprising the pre-comparator 27, the second PMOS transistor and the current source 211 for the second comparator block 26 has a corresponding function. It should be noted that in some exemplary embodiments it is also the case that only one of the comparator blocks 21, 26 has a corresponding supply circuit.

Figure 3:
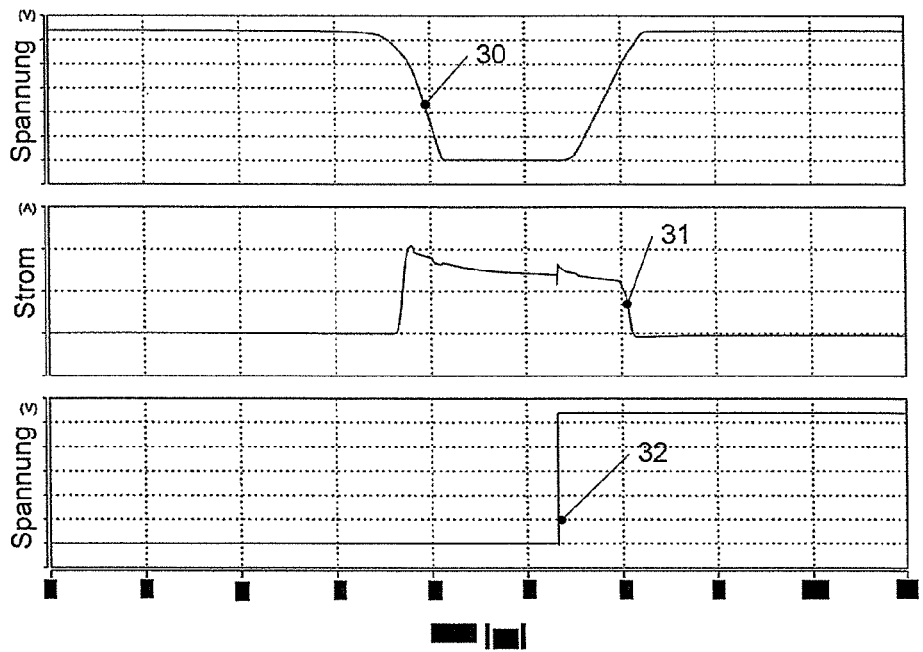
FIG. 3 are graphs that show examples of possible signal profiles in the oscillator circuit from FIG. 2.

In order to further elucidate the function of the exemplary embodiment in FIG. 2, FIG. 3 shows simulations for an example of an implementation of the exemplary embodiment in FIG. 2.

A curve 30 shows the output voltage of the pre-comparator 22 over time. As can be seen, the level falls between approximately 5.5 and 6.2 µs, which turns on the first PMOS transistor 24 and thus supplies the comparator 23 with current. The current taken up by the comparator 23 is illustrated by a curve 31 in FIG. 3. A curve 32 finally shows the level of the output signal of the oscillator circuit 20 in FIG. 2. It can be seen that the changeover of the output signal falls within the time period during which the comparator 23 is supplied with a relatively high current, as a result of which an accuracy of the changeover instant is increased.

Figure 4:
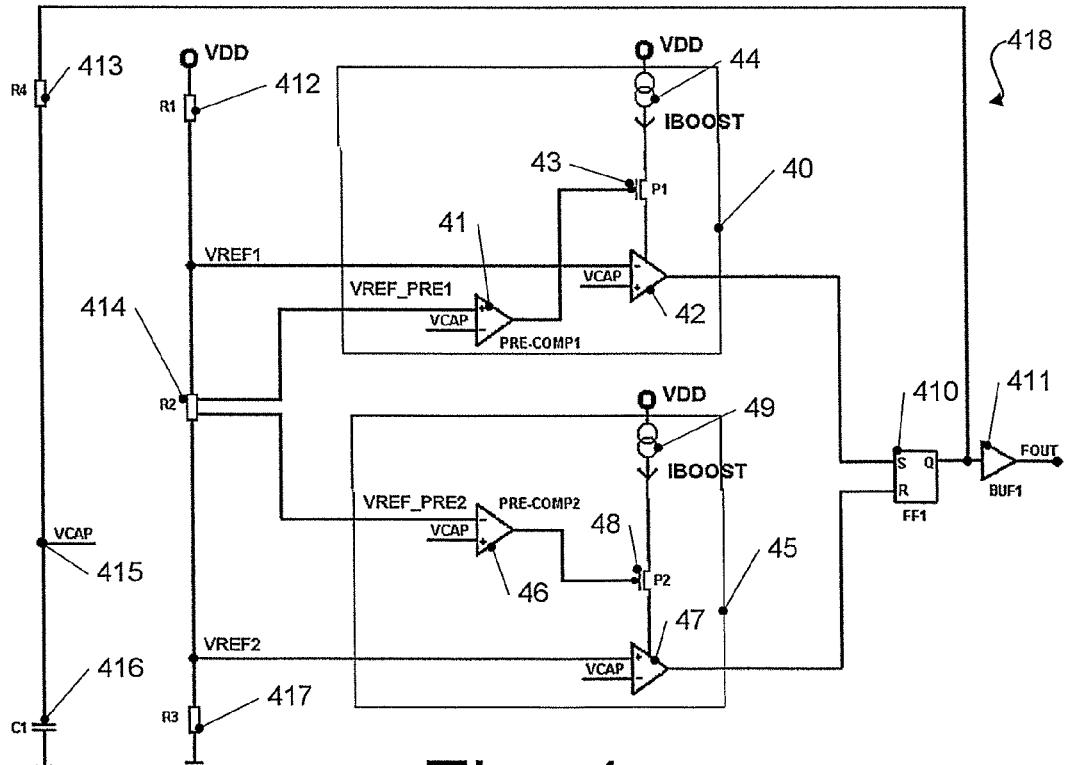
FIG. 4 is a circuit diagram of an oscillator circuit in accordance with a further exemplary embodiment.

A further exemplary embodiment of a relaxation oscillator in the form of an oscillator circuit 418 is illustrated in FIG. 4. The oscillator circuit 418 in FIG. 4 has a first comparator block 40 and a second comparator block 45. The first comparator block 40 has a pre-comparator 41, a comparator 42, a first PMOS transistor 43 and a current source 44. The second comparator block 45 has a pre-comparator 46, a comparator 47, a second PMOS transistor 48 and a current source 49. The fundamental functioning of the first comparator block 40 and of the second comparator block 45 is similar to the functioning of the comparator block 21 explained with reference to FIG. 2, and so the explanation will not be repeated in detail again and, in particular, the differences between the exemplary embodiment in FIG. 2 and the exemplary embodiment in FIG. 4 will be discussed below.

An output of the comparator 42 of the first comparator block 40 is coupled to a set input of a flip-flop 410, and an output of the comparator 47 of the second comparator block 45 is connected to a reset input of the flip-flop 410. An output of the flip-flop 410 outputs an output signal FOUT of the oscillator circuit 418 via a buffer 411. The output of the flip-flop 410 is additionally coupled via a resistor 413 to a first terminal of a capacitor 416, wherein a second terminal of the capacitor 416 is coupled to ground.

A voltage VCAP is tapped off at a node 415 between the capacitor 416 and the resistor 413, which voltage corresponds to a charge of the capacitor and is fed to the first comparator block 40 and to the second comparator block 45.

Moreover, a first reference voltage VREF1, which is closer to VDD, and a second reference voltage VREF2, which is closer to ground, are generated by a voltage divider, comprising a resistor 412, a resistor 414 and a resistor 417. The resistor 414 can comprise a plurality of resistor elements, and, moreover, a first further reference voltage VREF_PRE1 less than the first reference voltage VREF and a second further reference voltage VREF_PRE2 greater than the second reference voltage VREF2, but less than the first further reference voltage VREF_PRE1, can be tapped off at the resistor 414.

Unlike in the exemplary embodiment in FIG. 2, the exemplary embodiment in FIG. 4 does not involve successively charging a first capacitor and a second capacitor and evaluating the charging in each case by means of a comparator block; rather a single capacitor is used, wherein charging of the capacitor 416 is evaluated by means of the first comparator block 40 and discharging of the capacitor 416 is evaluated by means of the second comparator block 45.

If the output of the flip-flop 410 is at a high level, e.g. is equal to VDD, the capacitor 416 is charged, such that the voltage VCAP rises slowly. When the voltage VREF_PRE1 is reached, the first comparator 41 switches the first PMOS transistor 43 into a conducting state, such that the comparator 42 is supplied with a relatively high current from the current source 44. If the voltage VCAP then exceeds the first reference voltage VREF1, the comparator 42 switches from logic 1 to logic 0 (for example from VDD to ground or VSS), such that a logic 0 is then present at the set input of the flip-flop 410. At the same time, since VCAP in this case is also greater than the second reference voltage VREF2, the output of the comparator 47 is also logic 1 with lower accuracy, such that a logic 1 is present at the reset input of the flip-flop 410 and the output of the flip-flop 410 is thus switched to 0, e.g. ground or VSS. Consequently, the capacitor 416 starts to discharge, and VCAP decreases. If VCAP in this case falls below VREF1, the comparator 42 switches to logic 1 again. If VCAP then falls below VREF_PRE2, the pre-comparator 46 turns on the second PMOS transistor 48, as a result of which the comparator 47 is supplied with a high current. If VCAP then falls below the second reference voltage VREF2, the output of the comparator 47 is switched to logic 0, such that the flip-flop 410 switches to logic 1 again and, consequently, the cycle begins anew.

It should be noted that the exemplary embodiments illustrated should be considered only as an example and different variations are possible. By way of example, resistors, capacitors and the like can be realized by two or more individual resistor elements or capacitor elements. PMOS transistors can be replaced by NMOS transistors, and vice versa, if the circuit logic is simultaneously inverted. Moreover, by way of example, instead of the PMOS transistors 24, 210, 43 and 48, other types of switches can also be provided, for example circuits based on bipolar transistors. The different reference voltages used can be generated not only by means of voltage dividers, rather it is also possible to provide separate voltage sources therefor.

Figure 5:
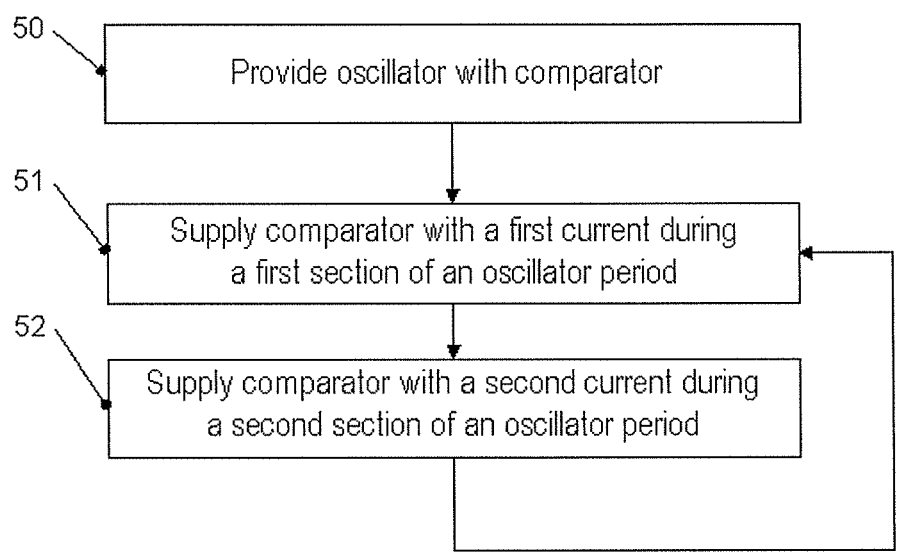
FIG. 5 is a flow chart of a method in accordance with one exemplary embodiment.

FIG. 5 illustrates a flowchart for elucidating one exemplary embodiment of a method according to the invention. The method in FIG. 5 can be carried out, for example, by the oscillator circuits in FIGS. 1, 2 and 4, but can also be used independently thereof.

At 50 an oscillator circuit with a comparator is provided, for example the oscillator circuit 10 with the comparator 12 in FIG. 1, the oscillator circuit 20 with the comparators 23 and 28 in FIG. 2, or the oscillator circuit 418 with the comparators 42 and 47 in FIG. 4.

At 51 the comparator is supplied with a first current during a first section of an oscillator period of the oscillator circuit, and at 52 the comparator is supplied with a second current during a second, different section of an oscillator period, wherein the second current is greater than the first current. The blocks 51 and 52 can then be repeated during each oscillator period of the oscillator circuit.

In this case, the first section can be, in particular, longer than the second section, such that the second, higher current is fed only during a relatively small part of an oscillator period, as a result of which a total current consumption can be kept relatively low.

What is claimed is:

1. An oscillator circuit, comprising:
    a comparator comprising a first comparator input, a second comparator input, an output, and a supply input; and
    a supply circuit coupled to the supply input of the comparator, wherein the supply circuit is configured to supply the comparator with a first current during a first section of an oscillator period of the oscillator circuit and supply the comparator with a second current during a second, different section of the oscillator period, wherein the second current is greater than the first current,
    wherein the supply circuit is configured to provide at least a portion of the second current by switchably coupling a current to the supply input of the comparator at a time prior to a changeover of the comparator at the output thereof.

2. The oscillator circuit of claim 1, wherein the second section of the oscillator period is selected such that a changeover of the comparator falls within the second section.

3. The oscillator circuit of claim 1, wherein the first current is equal to 0.

4. The oscillator circuit of claim 1, wherein the output of the comparator is coupled to an output of the oscillator circuit.

5. The oscillator circuit of claim 1, wherein the oscillator circuit comprises a relaxation oscillator.

6. The oscillator circuit of claim 1, further comprising a capacitance, wherein the first comparator input is coupled to the capacitance and the second comparator input is coupled to the reference voltage.

7. The oscillator circuit of claim 6, further comprising a charging circuit configured to charge the capacitance in a manner dependent on an output signal at the output of the comparator.

8. An oscillator circuit, comprising:
    a comparator comprising a first comparator input, a second comparator input, an output, and a supply input;
    a supply circuit coupled to the supply input of the comparator, wherein the supply circuit is configured to supply the comparator with a first current during a first section of an oscillator period of the oscillator circuit and supply the comparator with a second current during a second, different section of the oscillator period, wherein the second current is greater than the first current;
    a capacitance, wherein the first comparator input is coupled to the capacitance and the second comparator input is coupled to a reference voltage,
    wherein the supply circuit comprises:
        a current source configured to generate the second current;
        a switch, wherein the current source is coupled to the supply input of the comparator via the switch; and
        a further comparator, wherein an output of the further comparator is coupled to a control input of the switch, wherein a first comparator input of the further comparator is coupled to the capacitance, and wherein a second comparator input of the further comparator is coupled to a further reference voltage, and wherein the further reference voltage differs from the reference voltage.

9. The oscillator circuit of claim 6, further comprising:
    an additional comparator, wherein the additional comparator has a first comparator input, a second comparator input, an output and a supply input; and
    an additional supply circuit coupled to the supply input of the additional comparator, wherein the additional supply circuit is configured to supply the additional comparator with a third current during a third section of an oscillator period of the oscillator circuit and with a fourth current greater than the third current during a fourth, different section of the oscillator period.

10. The oscillator circuit of claim 9, wherein the additional supply circuit is configured in a manner corresponding to the supply circuit.

11. The oscillator circuit of claim 9, further comprising a further capacitance, wherein the first comparator input of the additional comparator is coupled to the further capacitance and the second comparator input of the additional comparator is coupled to the reference voltage.

12. The oscillator circuit of claim 9, wherein the first comparator input of the additional comparator is coupled to the capacitance and the second comparator input of the additional comparator is coupled to a second reference voltage.

13. A method for operating an oscillator circuit with a comparator, comprising:
    supplying the comparator with a first current during a first section of an oscillator period of the oscillator circuit; and
    supplying the comparator with a second current during a second, different section of the oscillator period, wherein the second current is greater than the first current, wherein supplying the comparator with the second current comprises providing at least a portion of the second current by switchably coupling a current to the supply input of the comparator at a time prior to a changeover of the comparator at an output thereof.

14. The method of claim 13, further comprising changing over an output value of the comparator during the second section of the oscillator period.

15. The method of claim 13, wherein the coupling of the current is dictated by a comparison between a varying voltage and a preliminary reference voltage that is less than a reference voltage employed by the comparator.

16. The oscillator circuit of claim 1, wherein the supply circuit further comprises a pre-comparator configured to changeover at an output thereof during the second section of the oscillator period before a changeover of the comparator, wherein the changeover at the output of the pre-comparator couples the supply current to the supply input of the comparator.

17. The oscillator circuit of claim 1, wherein the coupling of the current is dictated by a comparison between a varying voltage value and a preliminary reference voltage that is less than a reference voltage employed by the comparator.

18. The method of claim 15, further comprising:
comparing the reference voltage with a voltage present at a capacitance by means of the comparator.

19. The method of claim 15, further comprising:
changing over between the first current and the second current in a manner dependent on a comparison of the voltage present at the capacitance with the preliminary reference voltage, wherein the preliminary reference voltage differs from the reference voltage.

* * * * *